US008796709B2

(12) United States Patent
Rindt et al.

(10) Patent No.: US 8,796,709 B2
(45) Date of Patent: Aug. 5, 2014

(54) HOUSING FOR HIGH-POWER LEDS

(75) Inventors: Matthias Rindt, Landshut (DE); Josef Kiermeier, Essenbach (DE); Thomas Zetterer, Landshut (DE); Robert Hettler, Kumhausen (DE); Shaifullah Bin Mohamed Kamari, Marine Crescent (SG); Lea-Li Chew, Singapore (SG); Rohit Bhosale, De Royale (SG)

(73) Assignee: Schott AG, Mainz (DE)

( * ) Notice: Subject to any disclaimer, the term of this patent is extended or adjusted under 35 U.S.C. 154(b) by 438 days.

(21) Appl. No.: 12/990,437

(22) PCT Filed: Apr. 29, 2009

(86) PCT No.: PCT/EP2009/003109
§ 371 (c)(1),
(2), (4) Date: Jan. 27, 2011

(87) PCT Pub. No.: WO2009/132838
PCT Pub. Date: Nov. 5, 2009

(65) Prior Publication Data
US 2011/0108857 A1    May 12, 2011

(30) Foreign Application Priority Data
Apr. 29, 2008    (DE) .......................... 10 2008 021 435

(51) Int. Cl.
*F21V 5/04*     (2006.01)
*H01L 33/64*    (2010.01)
*H01L 33/48*    (2010.01)

(52) U.S. Cl.
CPC ..... *H01L 33/486* (2013.01); *H01L 2224/48091* (2013.01); *H01L 33/641* (2013.01); *H01L 2224/48247* (2013.01); *Y10S 362/80* (2013.01)
USPC .............. 257/98; 257/99; 257/414; 257/680; 257/294; 257/255; 257/256; 362/800

(58) Field of Classification Search
USPC .............. 257/98, 99, 414, 680; 362/294, 255, 362/256, 249.02, 800, 218, 373
See application file for complete search history.

(56) References Cited

U.S. PATENT DOCUMENTS 7,157,744 B2 *   1/2007   Palmteer et al. ................. 257/98
7,563,646 B2 *   7/2009   Carter ........................... 438/118

(Continued)

FOREIGN PATENT DOCUMENTS

DE          10118630        10/2002
DE          102004014207    10/2005

(Continued)

OTHER PUBLICATIONS

English translation of International Preliminary Report on Patentability dated Feb. 17, 2011 corresponding to International Patent Application No. PCT/EP2009/003109.

(Continued)

*Primary Examiner* — Michael Shingleton
(74) *Attorney, Agent, or Firm* — Ohlandt, Greeley, Ruggiero & Perle, L.L.P.

(57) ABSTRACT

A housing for radiation-emitting or radiation-receiving optoelectronic components such as LEDs and a method for producing the housing are provided. The housing has a base part and a head part that are joined by a glass layer. The top face of the base part defines an assembly region for an optoelectronic functional element and is also a heat sink for the optoelectronic functional element. The head part extends at least in sections over the peripheral extent of the assembly region, and above the assembly region it forms a passage area for the radiation emitted from or to be received by the optoelectronic functional element.

21 Claims, 9 Drawing Sheets

(56) References Cited

U.S. PATENT DOCUMENTS

| | | |
|---|---|---|
| 2005/0280019 A1 | 12/2005 | Konno |
| 2006/0012299 A1 | 1/2006 | Suehiro et al. |
| 2006/0261364 A1 | 11/2006 | Suehiro et al. |
| 2007/0201213 A1 | 8/2007 | Shin et al. |
| 2008/0203420 A1 | 8/2008 | Higaki et al. |
| 2009/0001396 A1 | 1/2009 | Higaki et al. |

FOREIGN PATENT DOCUMENTS

| | | |
|---|---|---|
| DE | 202007003496 | 5/2007 |
| GB | 2413698 | 11/2005 |
| JP | 2005116990 | 4/2005 |
| JP | 2005116990 A | 4/2005 |
| JP | 2006-012868 A | 1/2006 |
| JP | 2006012868 | 1/2006 |
| JP | 2006165029 | 6/2006 |
| JP | 2007251182 | 9/2007 |
| WO | 2004/082036 | 9/2004 |
| WO | 2006/013731 | 2/2006 |

OTHER PUBLICATIONS

International Search Report corresponding to International application No. PCT/EP2009/003109 dated Aug. 19, 2009.

Office Action dated Aug. 28, 2012 corresponding to Japanese Patent Application No. 2011-506607 with English translation.

Korean Office Action dated Jun. 5, 2013 corresponding to Korean Patent Application No. 10-2010-7026602 with English translation, 9 pp.

English translation of Japanese Office Action dated Sep. 3, 2013 corresponding to Japanese Patent Application No. 2011-506607, 2 pp.

* cited by examiner

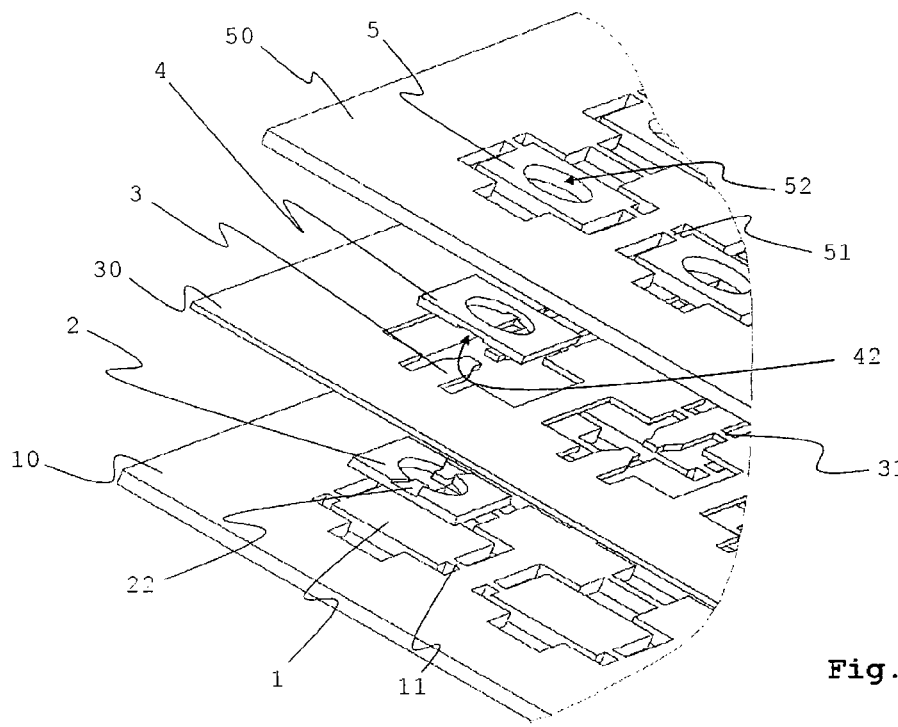
Fig. 1.a
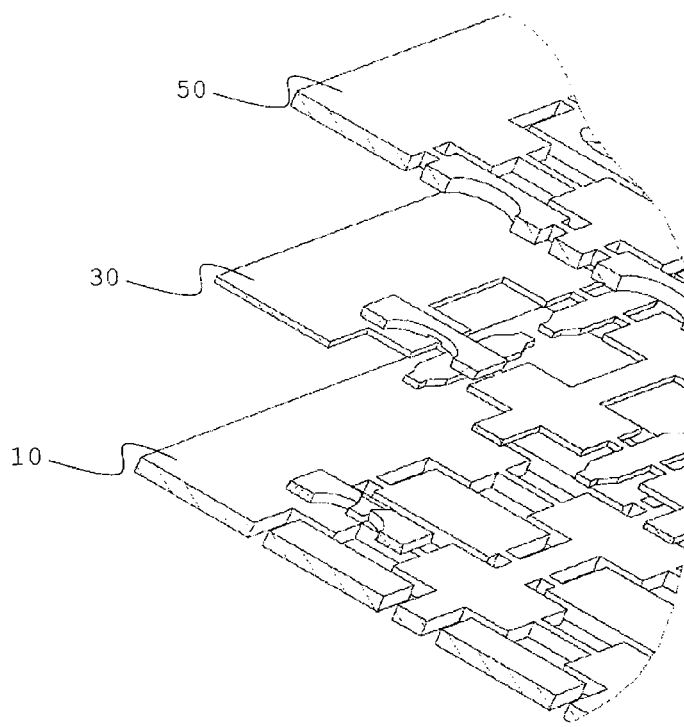
Fig. 1.b

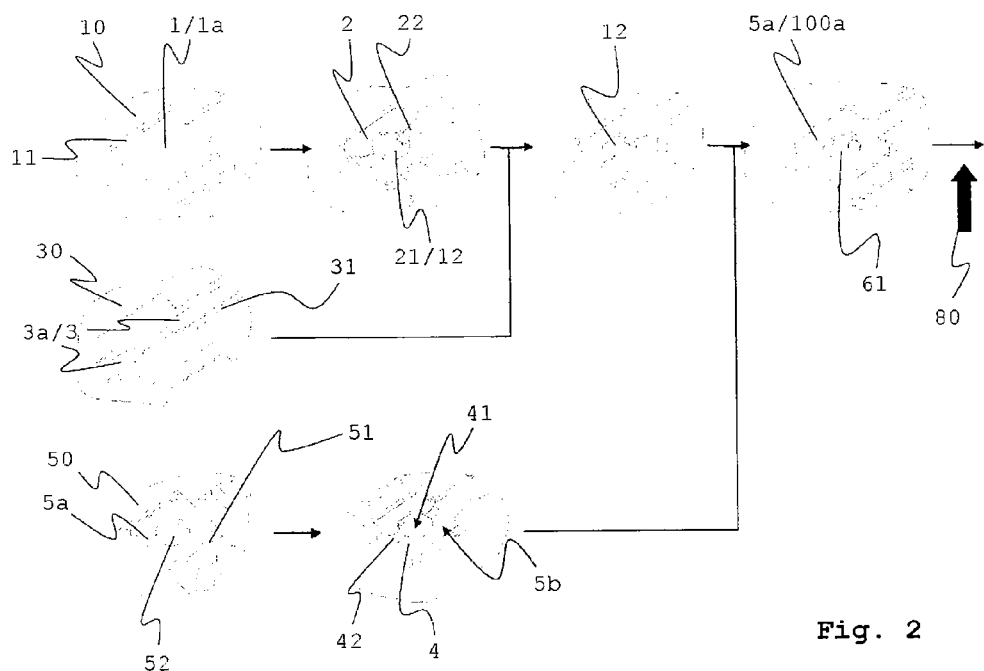
Fig. 2
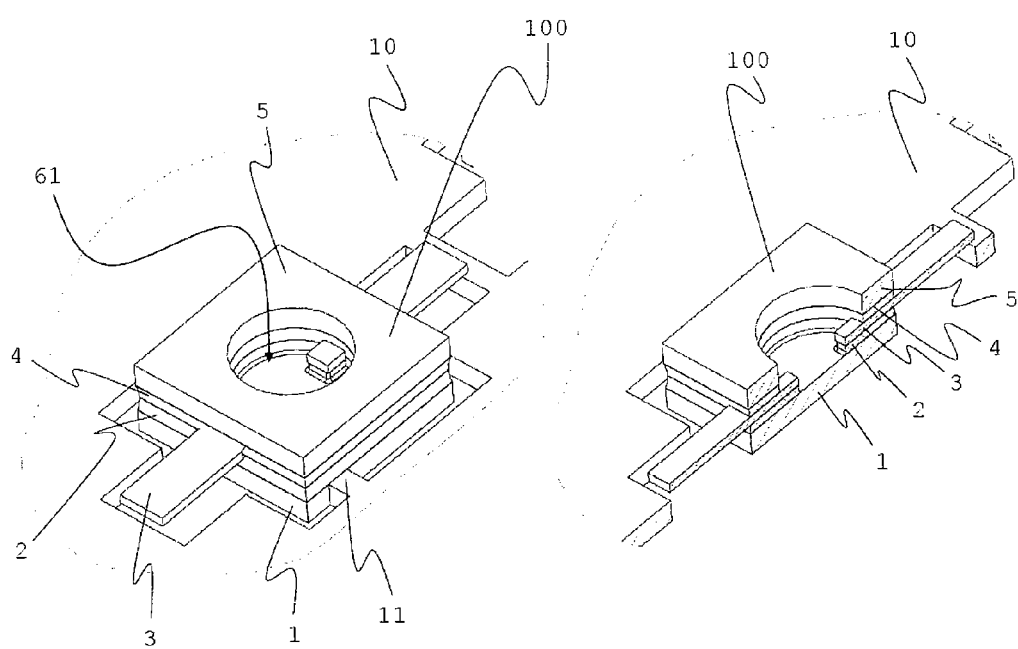
Fig. 3.a

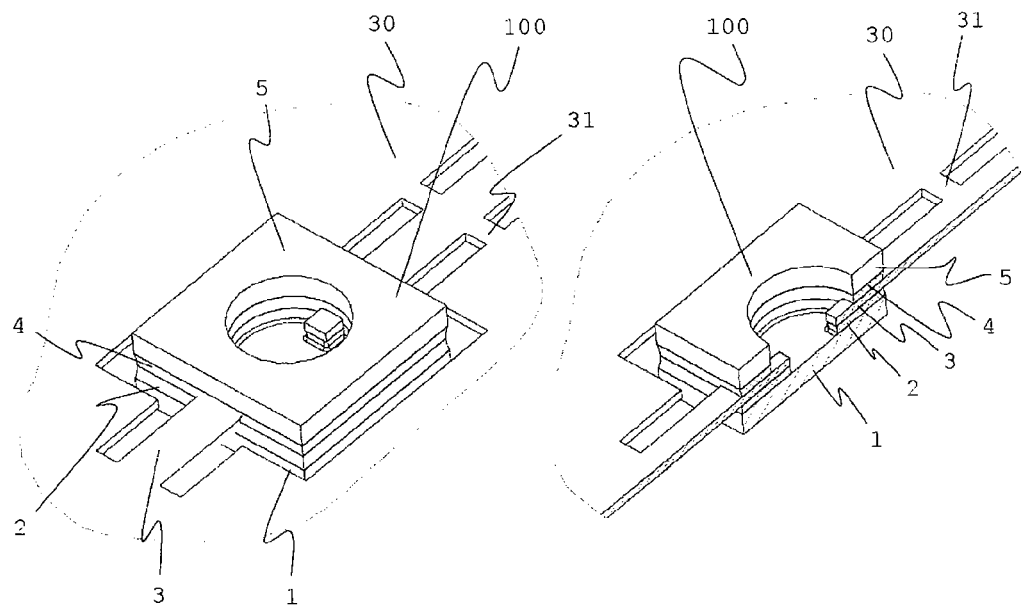
Fig. 3.b
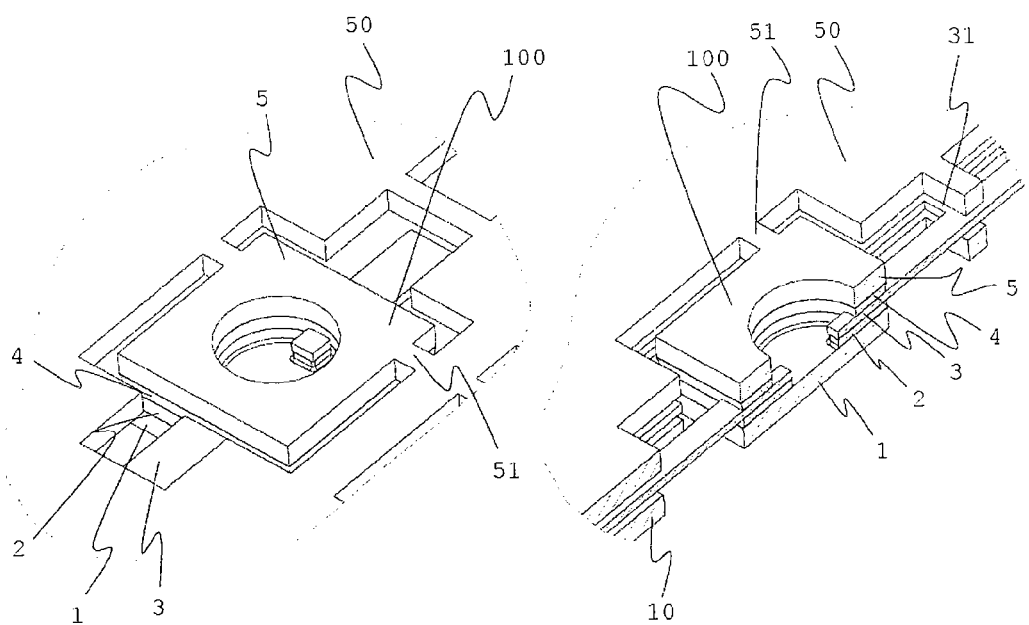
Fig. 3.c
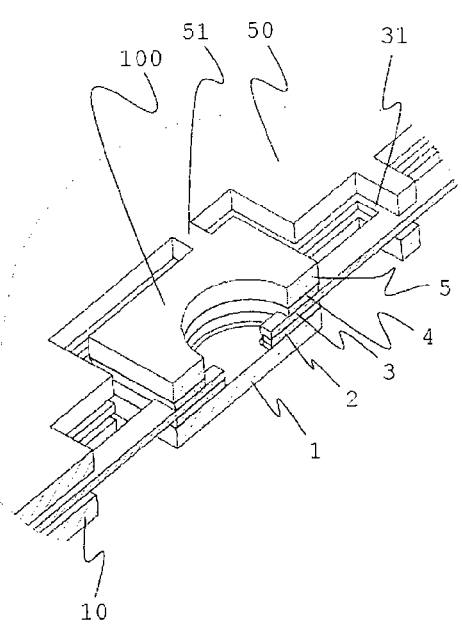
Fig. 3.d

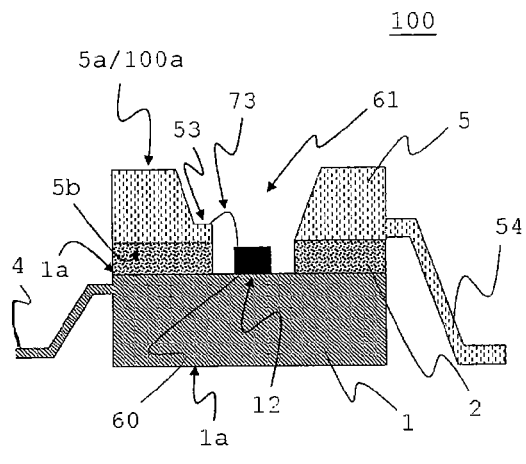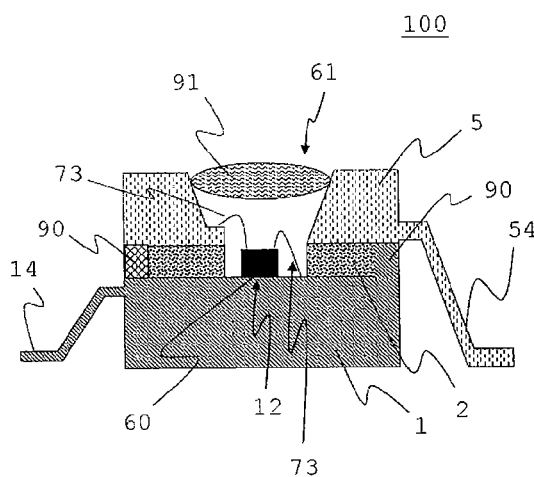
Fig. 4.a                    Fig. 4.b
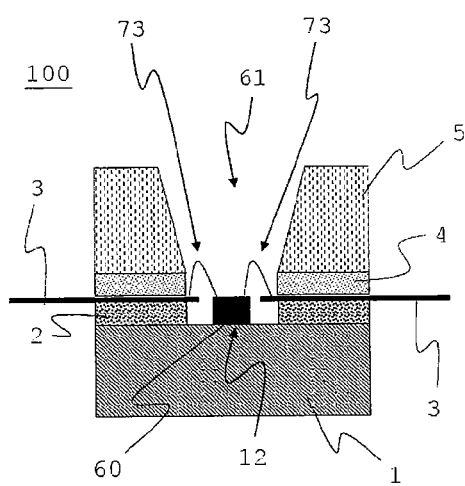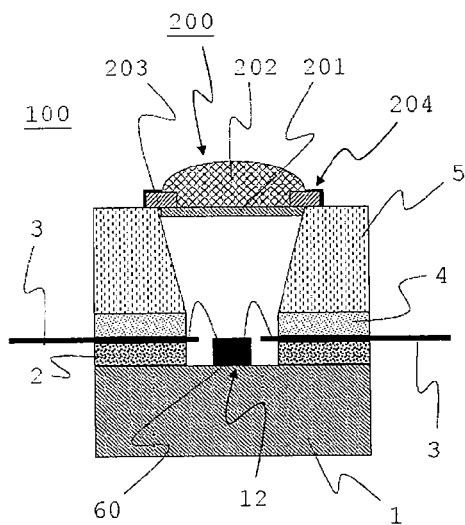
Fig. 4.c                    Fig. 4.d

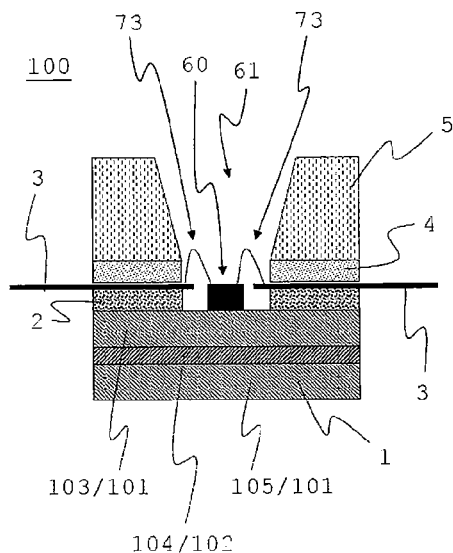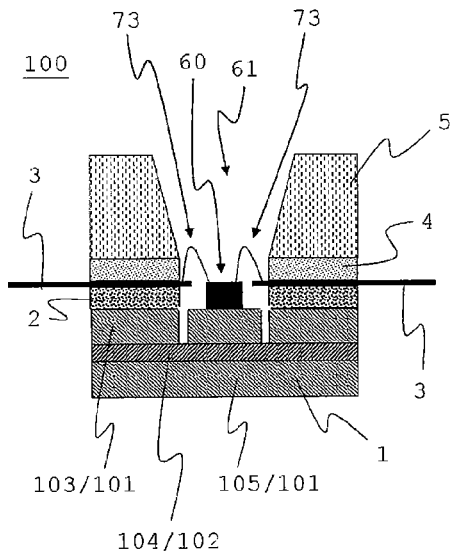
Fig. 4.e    Fig. 4.f
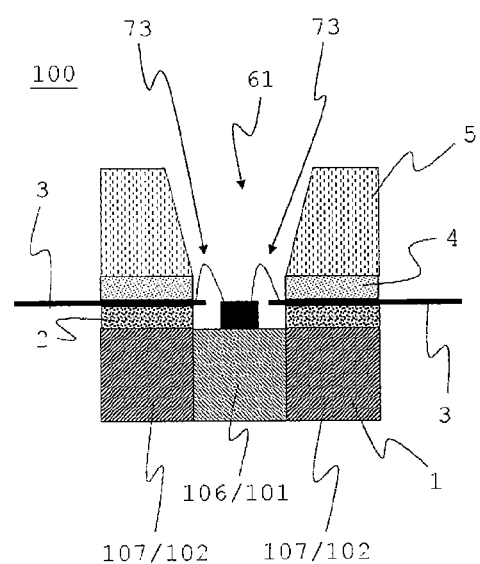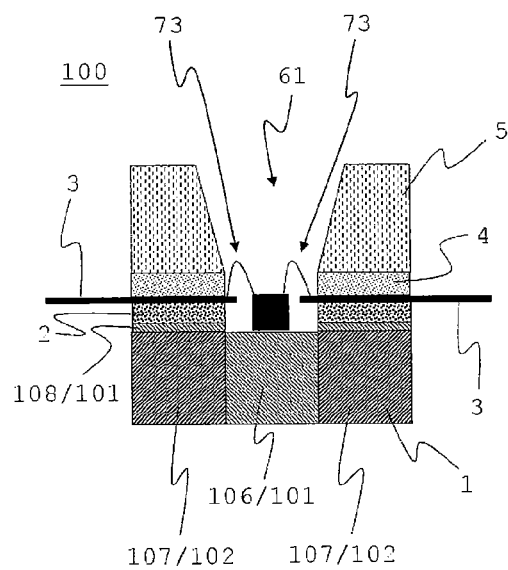
Fig. 4.g    Fig. 4.h

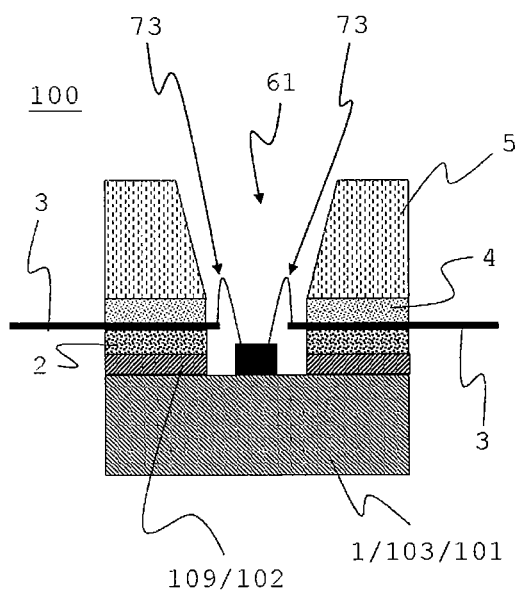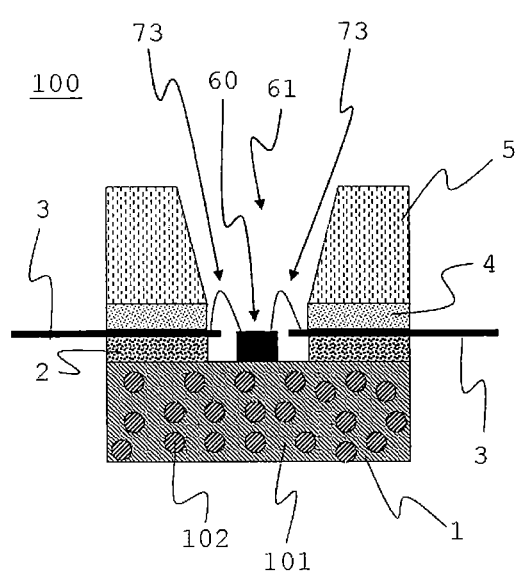
Fig. 4.i          Fig. 4.j

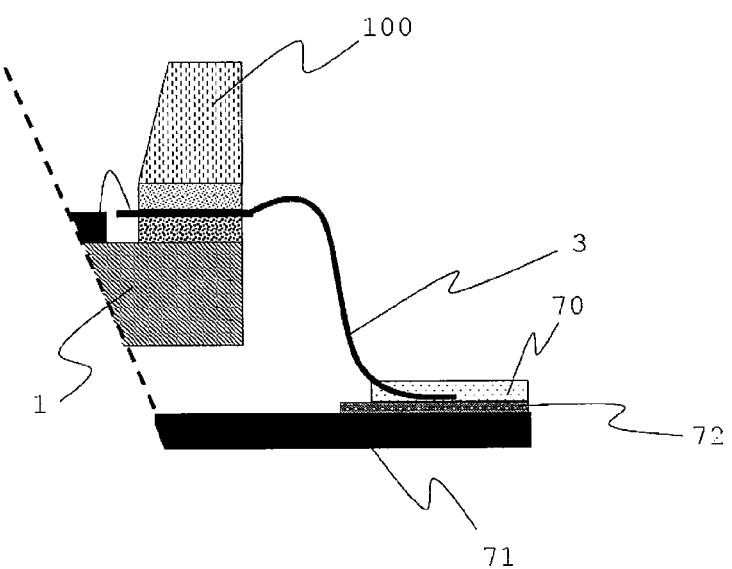
Fig. 5
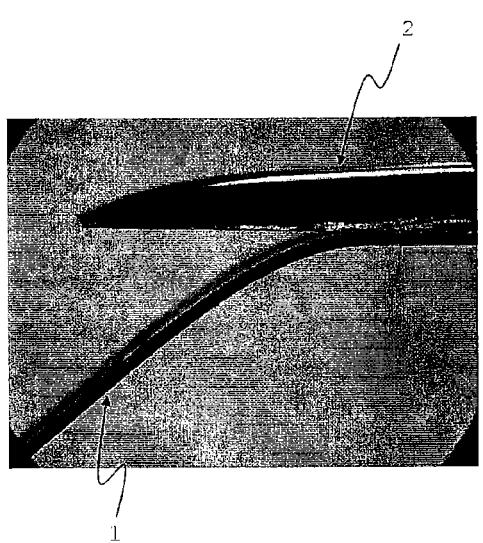
Fig. 6.a
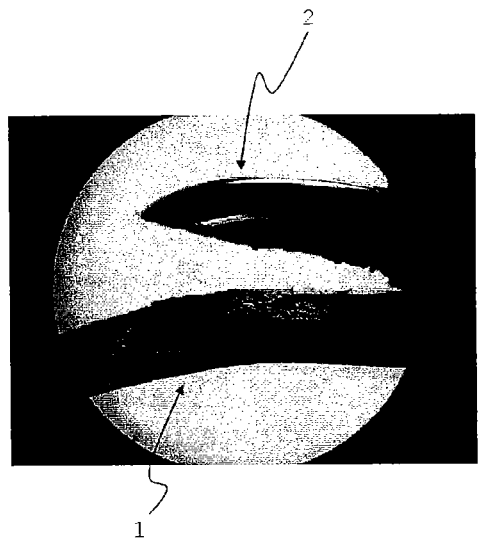
Fig. 6.b

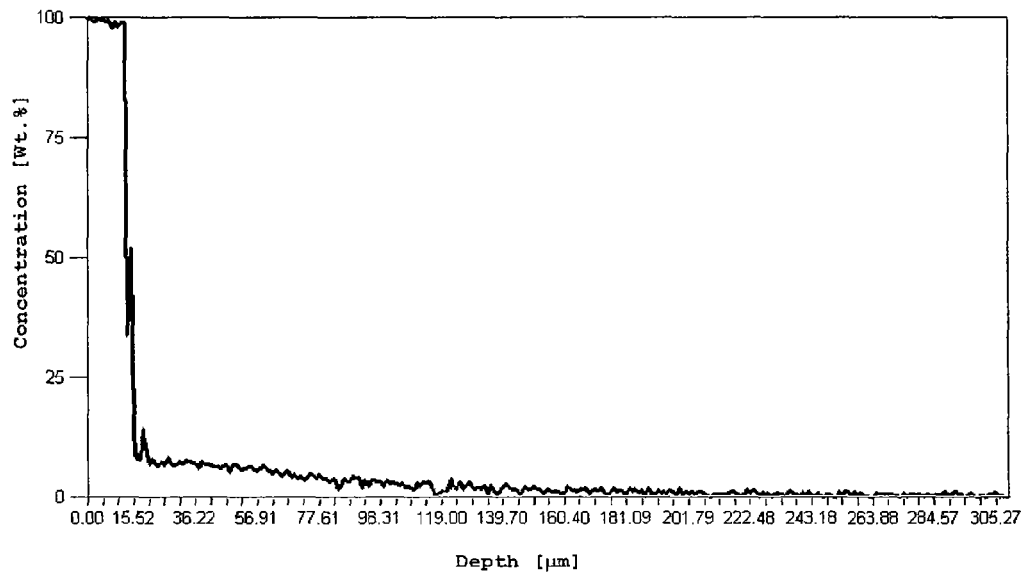
Fig. 6.c
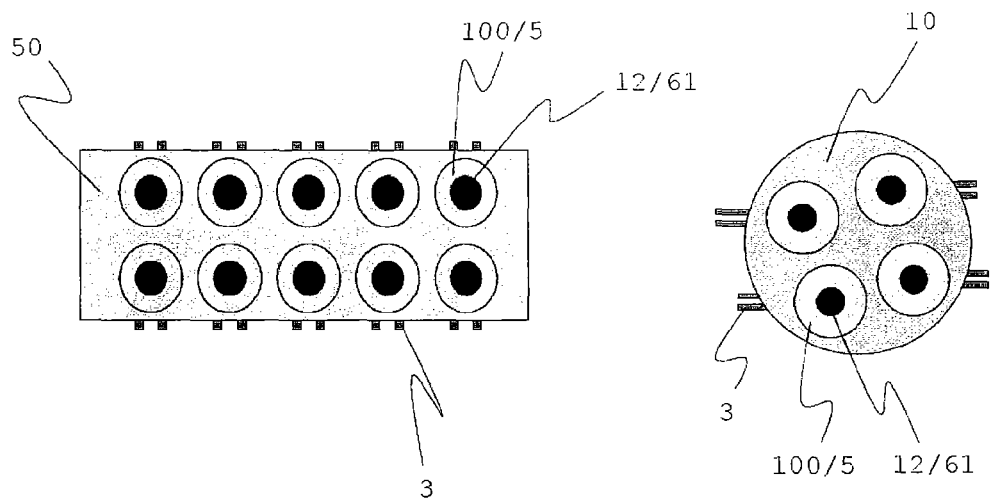
Fig. 7.a
Fig. 7.b

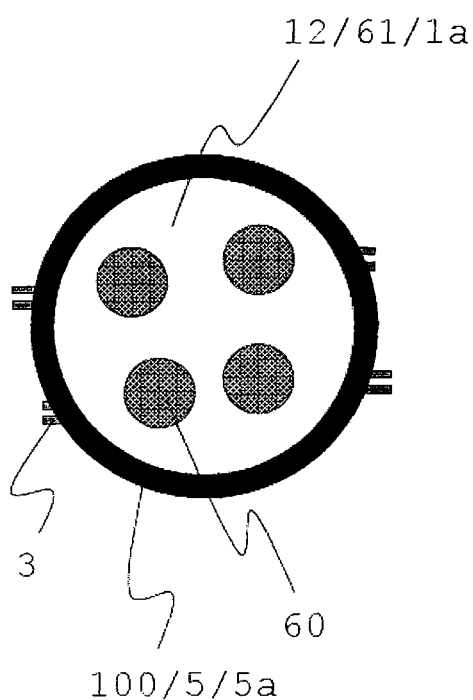
Fig. 7.c

HOUSING FOR HIGH-POWER LEDS

DESCRIPTION OF THE INVENTION

The present invention relates to a housing for optoelectronic components such as LEDs, and a method for producing said housing.

BACKGROUND OF THE INVENTION

So-called "High Power Light Emitting Diodes" (LEDs) at the present time are encapsulated in resin or plastic structures. Such a package or housing is described, for example, in WO 2004-053933 A2. Such a resin contains organic materials. These can lead to a reduction of service life of an LED because of processes such as outgassing and/or yellowing. Furthermore, an LED is not hermetically encapsulated in such a housing. Consequently, environmental influences can lead to degradation of materials, surfaces, and electrical connections. The thermal stability of the resin for high-output devices, for example 5-W LEDs, also represents a problem.

GENERAL DESCRIPTION OF THE INVENTIONS

With this background, the object of the present invention is to make available a housing for optoelectronic components, particularly for high-power LEDs, and a method for producing such a housing that at least reduce the drawbacks of the prior art described above.

It will be possible in this way to make available a housing that can have hermetic properties. The housing will also be economical to produce.

This object is achieved by the housing and the method pursuant to the independent claims. Advantageous embodiments are the subject matter of the particular subclaims.

Within the scope of the invention is a housing for an optoelectronic functional element, particularly an LED, comprising a composite at least of or composed of a base part and a head part, which are combined by means of at least a first glass layer that is positioned between the top of the base part and the bottom of the head part, and and a section of the top of the base part defines a mounting area for at least one optoelectronic functional element, so that the base part is a heat sink for the optoelectronic functional element, and the head part extends at least partially or completely over the peripheral extent of the mounting area and constitutes over the assembly region a passage area for the radiation emitted from and/or to be received by the optoelectronic functional element, in particular, wherein the head part comprises a metal and/or the base part comprises a metal and the top of the base part is pre-oxidized and/or the bottom of the head part is pre-oxidized.

The invention also extends to a method for producing an optoelectronic functional element housing, in particular, for an LED, comprising providing at least one base part whose top face preferably defines, at least in sections, an assembly region for at least one optoelectronic functional element, so that the base part constitutes a heat sink for the optoelectronic functional element, providing at least one head part that extends at least in sections or completely over the peripheral extent of the assembly region, forms a passage area and over the mounting area for the radiation emitted from and/or to be received by the optoelectronic functional element, in particular, wherein the base part is made available in a matrix with a plurality of base parts (1) and/or the head part is made available in a matrix with a plurality of head parts, providing or arranging at least a first glass layer between the top of the base part and the bottom of the head part, and assembling the base part, the first glass layer, and the head part, and heating the first glass layer until the glass reaches a viscosity at which the glass adheres and the base part and the head part form a composite at least by means of the first glass layer, in particular, so that a plurality of housings are produced at the same time, in particular, wherein the housing being fastened to the matrix with the plurality of base parts and/or to the matrix with the plurality of head parts through the base part and/or the head part by means of connecting crosspieces.

In one embodiment, the base part, the head part, and/or the connecting part mentioned later are each made available in a matrix. The housing according to the invention, in particular, can be produced or is produced by the method according to the invention. The method according to the invention is preferably designed for the production of the housing according to the invention.

The head part covers the base part in sections. However, it does not necessarily constitute the closure of the housing at its top. It constitutes, in particular, at least a section of a housing wall, or the housing wall. The head part can therefore also be called the housing wall or frame. The head part surrounds the assembly region, in particular, at least in sections, or completely. The functional element to be mounted is then positioned inside the head part. It also represents a kind of cover for the base part. In one embodiment, the head part constitutes or has at least one, particularly an electrical connecting area for the functional element. This region describes a section of the head part to which a wire, for example, or a conductor path can be fastened. A connection of the interior of the housing or of the functional element to the surroundings can be produced via the connecting area. If the head part is electrically conductive, the connecting area can be provided by the body of the head part itself. The head part in one embodiment is thus also a kind of conductor framework for the functional element to be mounted, which is preferably disposed inside the head part. To provide the connecting area, a projection or a soldering piece, a so-called soldering lug can be made on or fastened to the outside of the head part.

In one embodiment, the head part comprises or is composed of a material that has temperature stability up to at least 400° C. The head part preferably comprises at least one inorganic material or the head part is composed of at least one inorganic material. In one version the head part is thus an inorganic or essentially inorganic head part. In one embodiment the head part comprises or is a ceramic and/or a metal. In one embodiment the metal is a metal by itself or an alloy. The metal in this case is at least a member selected from the group composed of copper, aluminum, nickel, iron, preferably ferritic steel or special steel, and preferably austenitic steel or special steel. The head part with appropriate choice of materials also assists heat removal.

Since the head part in general is not in direct contact with the assembly region and the functional element to be mounted, or does not come into contact with them, the head part in one embodiment has at least one connecting area for a functional element on the inside. The functional element connecting area extends, in particular, at least in sections, over the peripheral extent of the mounting area. In one embodiment, the functional element connecting area is made as a base or a pedestal. This is preferably positioned or designed on the side at the bottom of the head part and projects into the passage area mentioned.

The passage area defines a region through which light or radiation can pass and can thus enter and/or exit. The passage area can thus also be called a passage. The passage area is preferably formed as an opening in the head part. For example, to assure an improved radiant output of an LED, the cross section of the passage area is enlarged, preferably continuously, from the bottom of the head part to its top. In one embodiment, the passage area, at least in sections, has essentially the configuration of a truncated cone or a truncated pyramid. After incorporation of the functional element, an optical component such as a lens can be disposed in the passage area or above the passage area for example, preferably as a lid. The optical component is preferably fastened so that the interior space is hermetically sealed.

In one embodiment, a so-called optics/converter system can also be placed in or above the passage area. The optics/converter system is preferably an optics/converter system that is described in the patent application with the name "Optics/Converter System for (W) LEDs." The patent application mentioned was submitted on the same day as the present patent application and has the internal file number 08SGL0020DEP and P3156. The scope of this patent application is incorporated to its full extent in the present patent application.

The material for the converter of the optics/converter system is preferably a material that is described in the patent application with the name "Conversion material especially for a white or colored light source comprising a semiconductor light source, method for producing the same, and light source comprising said conversion material." The patent application mentioned said submitted on the same day as the present patent application and has the internal file number 08SGL0097DEP and P3179. The scope of the patent application is incorporated to its full extent in the present patent application.

To improve the lighting, the inner surface or face of the passage area in one embodiment has reflecting properties, at least in sections. The reflecting properties, on the one hand, can be achieved by an appropriate processing of the inner surface, such as polishing. As an alternative or as a supplement, the inner surface can also be coated or clad in sections. Metals, for example, silver, represent a preferred material for such a coating or cladding. The passage area or the head part itself can thus also be called a reflector.

The optoelectronic functional element is preferably introduced into the housing through the passage area and fastened to the base part. The optoelectronic functional element is a radiation-emitting or radiation-receiving component. The functional element is preferably designed as a chip. The functional element is at least a component chosen from the group of LEDs, photodiodes, and laser diodes. The use of the housing pursuant to the invention is suitable, in particular, for high-output LEDs, preferably with a power greater than about 5 W, since efficient heat removal is necessary for them and the housing has to be sufficiently heat-stable. The present housing pursuant to the invention may be suitable also, in particular, for non-optoelectronic functional elements, such as, for example, power semiconductors whose use requires adequate heat stability, in particular. The housing pursuant to the invention may thus also be a housing for an optoelectronic functional element and/or a non-optoelectronic functional element. The same applies to the method pursuant to the invention. The passage area here is a region for inserting or introducing the functional element and/or a cavity resonator.

The at least one functional element is disposed on the base part. On the one hand, the base part represents the supporting element for the functional element. The base part can thus also be called a support or a foundation. The base part here can be one-part or can be divided into individual regions, and can thus be of segmented design (see below in this regard).

The functional element is in direct contact with the base part after installation in the housing. The top of the base part, especially the assembly region, is essentially flat in this case. The functional element can be cemented or soldered to the base part, for example. Lead-free soft solder is preferably used as solder. The adhesive is preferably a conductive adhesive, such as an epoxy resin enriched with silver. Thus a direct contact also means a contact through an adhesive, solder, or a binder.

Since the base part according to the invention also represents a heat sink for the functional element, it comprises materials that have an appropriate heat conductivity. The base part preferably has a thermal conductivity of at least about 50 W/mK, preferably at least approximately 150 W/mK. The base part can be thermally connected to other components. The base part preferably comprises at least one inorganic material, or the base part is composed of at least one inorganic material. In one version, the base part is thus an inorganic or essentially inorganic base part. In one embodiment, the base part comprises at least one metal or is a metal or an alloy. For example, a suitable metal is copper and/or aluminum and/or nickel and/or iron and/or molybdenum and/or copper-tungsten materials and/or Cu-molybdenum materials. However, passages or passage lines, so-called thermal vias, can also be introduced or disposed in the base part, such as, for example, copper vias in a board, for example, an Ni/Fe board.

In one embodiment of the invention, the base part is constructed by a type of "sandwich" construction and/or "multi-component" construction. To this end, the base part is made up of at least two layers. The at least two layers of the base part are arranged on top of one another or side by side. The base part in one embodiment is made up of at least a first material and a second material. The first material has a higher thermal conductivity than the second material. The second material has a lower thermal coefficient of expansion than the first material.

By the multilayered structure and/or construction from at least a first and a second material, it is possible, in particular, to adapt the thermal expansion of the base part to the thermal expansion of the first glass layer, and to make possible a corresponding heat removal from the functional element. To this end, the layer of the base part that comprises the first material is in thermal contact with the functional element. The layer of the base part that comprises the second material is positioned to match the thermal expansion of the first material to the thermal expansion of the first glass layer. The layer of the second material can be placed in and/or on the base part as an intermediate layer and/or as a kind of framework.

In one embodiment of the base part, it is structured at least in sections, in particular, on its top face. In this way, for example, individual sections of the base part can be made electrically insulated.

In another embodiment, the base part is constructed so that the first material is embedded in the second material or the second material is embedded in the first material.

In one embodiment, the base part has at least one, in particular electrical, connecting area for the functional element. This region describes a section of the base part to which a wire or a conductor path, for example, can be fastened. A connection of the interior of the housing or of the functional element to the surroundings can be produced through the connecting area. If the base part is electrically conductive, the connecting area can be provided by the body of the base part itself. For this purpose a projection or a soldering piece, a so-called soldering lug can be made on or fastened to the outside of the base part.

In one embodiment, the bottom of the head part is in direct contact with the first glass layer and/or the top of the base part is in direct contact with the first glass layer. The first glass layer is preferably positioned directly on the bottom of the head part and on the top of the base part to connect the base part and the head part. The first glass layer is adjacent to both the bottom of the head part and the top of the base part. Before assembly, the base part and the head part are aligned so that the top of the base part and the bottom of the head part are superimposed.

A 2-layered design makes a lower-cost production of housings possible. In another embodiment, the housing pursuant to the invention or the composite comprises a third layer. For this purpose, the composite pursuant to the invention also has at least one connecting part that is preferably joined to the composite at least by means of the first and/or a second glass layer. At least one, or the contacting of the functional element preferably occurs through the connecting part. The connecting part can also be called a conductor path, conductor strip, or conductor frame.

The connecting part extends through the wall of the housing. It constitutes at least a constituent of the wall of the housing. The connecting part projects into the inner space of the housing, preferably through the passage area, and/or out into the outer space. It is preferably positioned essentially centered in the housing wall, in particular, horizontally and/or vertically.

The inner space of the housing or the functional element is connected to the surroundings through the connecting part. A wire or conductor path can be fastened to the region that points to or projects into the inner space for contacting, for example. In the same way, a wire or a conductor path can be fastened to the region that points to or projects into the outer space for contacting, for example. The connecting part preferably projects so far into the inner space and/or into the passage area that the reception capability and/or the emission properties of the functional element are essentially not impaired.

The connecting part preferably comprises at least one inorganic material or the connecting part is composed of at least one inorganic material. In one version the connecting part is thus an inorganic or essentially inorganic connecting part. In one embodiment, the connecting part comprises or the connecting part is an electrically conducting material, preferably a metal or an alloy. In this case, the metal is at least a member selected from the group composed of copper, aluminum, nickel, iron, steel or special steel, ferritic steel or special steel and austenitic steel or special steel. With appropriate choice of materials, the connecting part thus also assists heat removal.

In one embodiment, the connecting part is disposed between the bottom of the head part and the top of the base part. In detail, the connecting part is disposed between the first glass layer and the second glass layer. In one embodiment, the bottom of the head part is in direct contact with the second glass layer and/or the top of the connecting part is in direct contact with the second glass layer. The first glass layer is adjacent to the bottom of the connection part and the top of the base part.

In the at least 3-layered system the head part assumes essentially the function of a light guide or focussing of the radiation emitted from and/or to be received by the functional element to be installed. The functional element is contacted essentially by means of the connecting part. In the 2-layered system, on the other hand, the head part assumes essentially the function of a light guide and a contacting.

The use of glass instead of the adhesives used in the prior art makes possible an improved and permanent bonding and a hermetic encapsulation of the functional element in the housing. A glass layer also means a glass sheet. Each of the glass layers is positioned between the appropriate components. The housing pursuant to the invention is preferably an inorganic or essentially inorganic housing.

The glasses used for the glass layers have a softening point or a softening temperature in a range that is below the melting point of the materials that are used for the head part, the base part, and/or the connecting part. The first glass layer can be provided by applying the first glass layer to the bottom of the head part and/or to the top of the base part. The second glass layer can be provided by applying the second glass layer to the bottom or the top of the connecting part.

The glass and the first and/or the second glass layer are provided by screen printing, by dispensing, by means of a preferably punched glass strip, and/or by means of an individual preform. A glass strip, for example, can be made available in the form of a strip of cast slip. In one embodiment the first glass layer and/or the second glass layer are both prepared in a matrix.

In particular, after the layers are stacked, the glass, in this case the first glass layer and/or the second glass layer, is/are heated until the glass reaches a viscosity at which the glass adheres to the particular layers and the layers are thus joined. The glass preferably has a viscosity in a range of $10^7$ Pas to about $10^3$ Pas when joined. The particular glass layer enters into a cohesive bond with the adjacent layers. Heating is conducted, for example, in a furnace. The layers can also be pressed together during the heating or in the range of the softening temperature. The "collapsing" of the first and/or of the second glass layer can be controlled through the temperature and/or the time of the sealing sequence. The assembly or cementing occurs over a time period of about 5 min to about 30 min, preferably of about 10 min to 15 min. In this period of time the organic binder and/or residual solvent present in the glass is essentially completely burned off.

The glass of the first glass layer is preferably a phosphate glass and/or a soft glass. The glass of the second glass layer is likewise preferably a phosphate glass and/or a soft glass. Examples of a phosphate glass are the glasses with the designation SCHOTT G018-122. Examples of a soft glass are the glasses with the designation SCHOTT 8061 and/or SCHOTT 8421. Phosphate glasses are heated to a temperature in the range of about 300° C. to about 450° C. Soft glasses are heated to a temperature in the range of about 700° C. to about 900° C. A low temperature makes possible faster and simpler processing, on the one hand. On the other hand, the housings produced therewith are not so chemically resistant. Thus various processes can no longer be performed with the individual layers, for example, metal-plating, when the housing is assembled.

In one embodiment, the first glass layer and/or the second glass layer is (are) reduced in height in the region that rests on the connecting part. The reduction of height is such that the height or extent of the connecting part is essentially compensated. The connecting part is thus embedded between the first and the second glass layers, so to speak. If the connecting part or the plurality of connecting parts in this case do not extend completely over the periphery around the assembly region and up to the edge of the housing, the first and second glass layers adjoin one another directly in sections.

In another embodiment at least one spacer is placed between the layers. After assembly, the spacers are located in the plane of the particular glass layer. In detail, at least one spacer is placed between the base part and the head part and/or between the base part and the connecting part and/or between the head part and the connecting part. The "collapsing" or "falling together" of the glass layer due to softening can thereby be selectively limited, and a minimal spacing can be defined. The thickness of the particular glass layer can thus be set in a targeted manner. The spacer has a melting point or a softening point higher than the glass.

The spacer in one embodiment is a separate component that is preferably placed between the layers. For example, the spacer can be a kind of strip. Possible materials for the spacer include metal, ceramics, glasses with a softening point higher than the glass used to bond the layers.

In an alternative or supplementary embodiment, the spacer is formed by an appropriate configuration of at least a section of the base part, of the head part, and/or of the connecting part. To this end, for example, a type of base or pedestal can be made in at least a section of the top of the base part and/or of the bottom of the connecting part and/or of the top of the connecting part and/or of the bottom of the head part.

The shape and dimensions of the first and/or of the second glass layer are adapted to the shape and the dimensions of the head part, base part, and connecting part. The first glass layer and/or the second glass layer extend(s) over the peripheral extent of the housing. Each of them has a recess in the interior. This recess, on the one hand, provides the assembly region. On the other hand, it can also be a component of the passage area.

The housing has a footprint of about 5 mm$^2$ to about 1000 mm$^2$. In a view of the top of the housing from above, the ratio of the surface area of the first glass layer or of the second glass layer to the surface area of the housing is about 1/10 to about 9/10, preferably from about 1/4 to about 3/4. This makes possible a stable composite and an adequate hermetic sealing. To make possible good adhesion and a hermetic composite or joint, the first glass layer and/or the second glass layer has (have) a thickness of about 100 μm to 500 μm. The base part has a thickness of about 0.2 mm to about 2 mm. The head part has a thickness of about 0.2 mm to about 2 mm. The connecting part has a thickness of about 0.1 mm to about 0.3 mm.

To produce a better adhesion of the glass layers to the particular layer, in detail to the head part and/or the base part and/or the connecting part, the glass contact surface areas of the head part and/or of the base part and/or of the connecting part are pretreated. The pretreatment can roughen the glass contact surface areas, for example. The pretreatment can be performed, for example, by etching and/or pre-oxidizing the glass contact surface areas. Pre-oxidizing means a targeted and controlled oxidation of a surface, for example in an atmosphere containing oxygen. Oxidation has proved to be beneficial for producing a solid connection between the metallic components and the glass layers. In detail, the oxidation of the top of the base part and/or of the bottom of the head part, i.e. of the glass contact surface areas of the base part and/or of the head part, has proved to be very advantageous.

A composite of glass and copper or copper oxide has surprisingly proved to be very stable. To accomplish this, in one embodiment, at least the top of the base part and/or at least the bottom of the head part are made ready by copper. In a preferred embodiment of the invention, all or essentially all metal-glass contact surface areas in a housing are formed as copper-glass contact surface areas or as copper oxide-glass contact surface areas. The copper can be formed available by constructing the component itself of copper. The copper can also be made available by an applied layer of copper. This layer can be applied, for example, by electroplating, laminating, and/or rolling. Phosphate glass and/or soft glass have proved to be very beneficial in combination with copper.

The metal, preferably the copper, is oxidized in a targeted manner for this purpose in an atmosphere containing oxygen. A basis weight of about 0.02 to about 0.25 mg/cm$^2$, preferably about 0.067 to about 0.13 mg/cm$^2$ oxide weight, has proved to be advantageous for the oxide weight. The oxide adheres well and does not flake off. The oxide "flakes" at a basis weight of about 0.27 mg/cm$^2$ oxide weight or above. At or above a basis weight of about 0.5 mg/cm$^2$ oxide weight, there is "heavy" oxide. The oxide layer "jumps" from the metal surface, so to speak.

To improve the particular properties, for example, the reflectivity, the bondability, and/or the electrical conductivity of the head part, of the base part, and/or of the connecting part, they can also be coated and/or clad. Metal-plating represents one method. Depending on the processing temperature and the softening temperature of the varieties of glass used, the coating is performed before assembling the individual layers and/or thereafter.

In one embodiment of the invention, the connecting part, the connecting region of the head part and/or the connecting region of the base part are brought together in such a way that a plurality of functional elements can be provided for or are provided for by means of a single anode and/or by means of a single cathode.

In another embodiment, a plurality of functional elements can be connected to or are connected to the connecting part, the connecting region of the head part, and/or the connecting region of the base part, so that a plurality of functional elements can be provided for or are provided for by means of a single anode and/or by means of a single cathode.

The head part, the base part, and/or the connecting part is (are) each produced by a so-called conductor frame method if they are made of a metallic material. Examples of such a production method are photochemical etching, punching, laser cutting, and/or water jet cutting. In one embodiment of the invention, preferably only materials or metals that can be punched are used to produce the base part, the connecting part, and/or the head part, particularly with a view to the favorable production costs. In one embodiment, a board is structured in such a way that a plurality of components are formed per board. The housing is a component of a matrix of individual housings. A matrix is then a type of foundation in which the particular component is inserted or disposed. An arrangement or a matrix that comprises a plurality of housings, preferably of the housings described above, therefore also lies within the scope of the present invention. The individual housings are fastened to the particular matrix by means of so-called crosspieces or connecting tabs. In order to facilitate later separation, the individual housings can already be loosened from individual matrices. This is done after the composite is produced. It is then sufficient if the housing is fastened to at least one matrix through the base part, the head part, and/or the connecting part. The arrangement is thus characterized in that the connection of the housing to at least one matrix is released, preferably essentially completely.

The structuring of the matrix that provides the connecting part in one embodiment is designed so that the connecting part is brought together with a line in such a way that a plurality of housings and/or functional elements are supplied simultaneously by a single anode and/or by means of a single cathode. In detail, the connecting parts, the connecting regions of the head parts, and/or the connecting regions of the base parts of the individual housings are brought together in such a way that a plurality of housings can be supplied by means of a single anode and/or by means of a single cathode. In another embodiment, the connecting part, the connecting region of the head part, and/or the connecting region of the base part of an individual housing are brought together in such a way that a plurality of functional elements can be supplied in one housing by means of a single anode and/or by means of a single cathode. At least two connecting parts per housing are provided in order to supply multiple functional elements in one housing.

The invention also covers an optoelectronic component that comprises a housing pursuant to the present invention and at least one optoelectronic functional element, particularly an LED, which is positioned in the housing.

A lighting device that includes at least one housing and/or one optoelectronic component pursuant to the present invention is also within the scope of the present invention. Examples of the lighting device are a seat light; a reading light; a work light, particularly one that can be integrated in ceilings or walls; object lighting in furniture and/or buildings; a headlight and/or a rear light and/or an interior light and/or an instrument or display light, preferably in motor vehicles; and/or a background lighting for LCD displays.

The present invention will be explained in detail with reference to the examples of embodiment below. Reference is made to the attached drawings in this regard. The same reference symbols in the individual drawings refer to the same parts.

FIGS. 1.a and 1.b illustrate in a perspective view the combination of three matrices with a plurality of components to produce three-layered housings.

FIG. 2 shows schematically the individual steps of the method for producing the housing.

FIGS. 3.a to 3.d show schematically a detail view of an excerpt of a matrix with housings arranged therein.

FIGS. 4.a to 4.j show schematically various embodiments of the housing pursuant to the invention.

FIG. 5 illustrates the final appearance of a connecting part.

FIGS. 6.a to 6.c show experimental results on the adhesion of glass to a metal strip (FIGS. 6.a and 6.b), and on the depth distribution of copper in glass (FIG. 6.c).

FIGS. 7.a to 7.c show schematically an arrangement of housings (FIGS. 7.a and 7.b) and an arrangement of LEDs in one housing (FIG. 7.c).

DETAILED DESCRIPTION OF THE INVENTION

FIGS. 1.a and 1.b illustrate the individual components of a three-layered system before it is produced. FIG. 1.b shows a cross section of FIG. 1.a. The three-layered system or housing 100 here is composed of a base part 1, two connecting parts 3 that are arranged in a plane, and a head part 5 that is called a reflector 5 below, which are or will be connected through a first glass layer 2 and a second glass layer 4. The base part 1 is joined to the two connecting parts 3, which are called conductor strips 3 below, by means of the first glass layer 2. The conductor strips 3 themselves in turn are connected to the reflector 4 by means of the second glass layer 4.

To make reduced-cost production of housings 100 possible, the components 1, 3, 5, are each arranged in a matrix 10, 30, 50. A plurality of housings 100 can thus be produced at the same time. The components 1, 3, 5 here are all made of metal. The particular matrix 10, 30, 50 is produced by structuring a metal board. The base part 1, the head part 3, and the connecting part 5 are thus each made ready by a structured metal board. A board here is structured in such a way that a plurality of components 1, 3, 5 are formed per board. Possible methods for structuring are photochemical etching, punching, laser cutting, and/or water jet cutting. The components 1, 3, 5 are fastened to the particular matrix 10, 30, 50 or to the particular frame through so-called connecting crosspieces 11, 31, 51 or fastening crosspieces 11, 31, 51. The metal boards mentioned above can also be clad, for example, before structuring or after structuring as a matrix. Reference is made to the following FIG. 2 for details on the individual method steps. FIGS. 4a to 4.d illustrate possible embodiments of the housing 100 that can be produced by the method pursuant to the invention.

FIG. 2 illustrates the individual method steps for producing the housing 100 pursuant to the invention. The method is carried out with a plurality of components in a matrix. However, it will be explained on the basis of only a single housing 100. The base part 1, which constitutes the support and the heat sink for an LED 60 to be installed, is made ready first. The first glass layer 2 is applied to the top 1a of the base part 1. A screen printing method represents one possible method for applying the first glass layer 2. The first glass layer 2 has a recess 21 in its center. The LED 60 or the LED chip is mounted in this recess 21, preferably after the complete assembly of the housing 100. The "kept-open" surface area on the base part 1 or a portion thereof constitutes the assembly region 12 for the LED 60. The recess 21 in the first glass layer 2, however, can also be a component of the passage area 61 at the same time. The first glass layer 2 extends completely over the peripheral extent of the assembly region 12. The regions 22 of the first glass layer 2, in which the two conductor strips 3 are subsequently mounted have a reduced height. This region 22 also extends into the center of the housing 100. The regions 22 of reduced height preferably essentially completely constitute a rest or support surface area 22 for the conductor paths 3.

In a next step of the method the matrix 30 is provided with the conductor paths 3. The housing 100 here is equipped with two connecting parts 3 or conductor paths 3. The connecting parts 3 are positioned on the first glass layer 2 in such a way that they come to rest on the regions 22 of reduced height.

The reflector 5 is provided in a following method step. The reflector has a recess 52 in its interior. This recess 52 later constitutes the passage area 61 or a component of the passage area 61. A second glass layer 4 is placed or applied on the bottom 5b of the reflector 5. A possible method for applying this second glass layer 4 in turn is a screen printing method. The glass layer 4 also has a recess 42 in the center and thus over the assembly region 12. The second glass layer 4 can have a uniform height. The regions 42 of the second glass layer 4 here have a reduced height. The regions 42 of reduced height preferably essentially completely constitute a rest or support surface area 42 for the conductor paths 3.

In a following step of the method, the structure of the base part 1, the first glass layer 2, and conductor strips 3 are brought together with the structure of the second glass layer 4 and the reflector 5. They are assembled in such a way that the second glass layer 4 is positioned in sections between the conductor strips 3 and the reflector 5. Since the two conductor strips 3 do not extend completely over the peripheral extent of the housing 100, the first glass layer 2 and the second glass layer 4 also come into contact.

After the individual layers 1, 3, 5 are stacked, so to speak, the glasses 2 and 4 are heated, for example, by radiant heat 80, so that such a low viscosity is reached that the layers 1, 3, 5 are joined to one another. Pressure can be provided in addition to press the layers 1, 3, 5 together. A temperature range of about 300 to 450° C. is reached here for a phosphate glass. For a soft glass, on the other hand, a temperature range of about 700 to 900° C. is reached. The "collapse" or "falling together" of the glass layers 2 and 4 can be controlled by the temperature and the sealing time. It is also possible to place so-called spacers 90 between the individual layers 1, 2, 3, which define a minimum spacing between the individual layers 1, 2, 3. The spacers 90 can be a component of the housing 100. However, they can also be positioned on the particular matrix 10, 30, 50.

Depending on the glass used, the optional cladding of the individual layers 10, 20, 30 or 1, 2, 3 can be performed before or after assembly. In the case of a glass with lower softening point, such as phosphate glass, and the resulting lower sealing temperature, all metal components 10, 20, 30 or 1, 2, 3 are preferably metal-plated before they are assembled into the housing 100. This also provides the flexibility that different layers 10, 20, 30 or 1, 2, 3 can be coated or metal-plated with different materials without the need for using a covering, so-called "masking," or other costly, selective plating technologies. For example, the conductor strips 3 or 30 can be plated with gold in order to improve pass-through wire bonds, so-called "wire bonding." The other layers 1 and 5 or 10 and 50 can be plated with nickel, for example. Silver, for example, can also be provided on the inside of the passage area 61 or of the recess 52 to make increased reflectivity possible.

After the assembly of the three matrices 10, 30, 50, the composite formed can be directly made available, for example, to position a plurality of LEDs over the passage area 61 on the assembly region 12 of the particular housing 100. After the assembly, however, the housings 100 can also be completely or partially separated from the particular matrix 10, 30, 50 by a separating procedure, for example by cutting, such as laser cutting. For example, in case of a three-layered system and thus three joined matrices 10, 30, 50, the components 1 and 3 or 1 and 5 or 3 and 5 can be split off in two matrices 10 and 30 or 10 and 50 or 30 and 50. In a two-layered system and thus with two joined matrices 10 and 50, the components 1 and 5 can be separated in a matrix 10 or 50. In both cases, the housings 100 each remain in an arrangement or in a matrix. A plurality of housings 100 can thus be handled in a simple way, on the one hand. On the other hand, the housings 100 can be separated individually in a simple way, such as after a possible process of mounting the LEDs, since they are only still fastened to a matrix 10 or 30 or 50. One possible method for separating the housings 100 from the matrix 10 or 30 or 50 is punching. The individual possibilities for how a plurality of housings 100 can be provided are illustrated in FIGS. 3.*a* to 3.*d*. FIG. 3.*a* illustrates in perspective a top view (left) and a cross section (right). The housings 100 here are still positioned in the matrix 10, which makes up the base parts 1, only through the connecting crosspieces 11 of the base parts 1. FIG. 3.*b* shows in perspective a top view (left) and a cross section (right), and shows an embodiment in which the housings 100 are positioned in a matrix 30 through two connecting parts 3 and/or through the connecting crosspieces 31. FIG. 3.*c* shows another embodiment in which the housings 100 are positioned on or fastened to the matrix 50 through the connecting crosspieces 51 of the reflector 5. FIG. 3.*d* shows an embodiment in which the housings 100 are still positioned on or fastened to all three matrices 10, 30, and 50.

FIGS. 4.*a* to 4.*c* illustrate in a cross section various embodiments of a housing 100 after it is detached singly or after it is separated out of the composite matrix or out of the joined matrices 10, 30, 50. FIG. 4.*a* shows a 2-layered housing. It is composed of a head part 5 and a base part 1 that are connected through a first glass layer 2. There is an LED 60 positioned inside the housing 100. The LED 60 is positioned on the assembly region 12 that is provided by a section of the top is of the base part 1. The passage area 61 for the light that it emits is located above the LED 60. The LED 60 here has a contact positioned on its front face and a contact positioned on its back face. The front contact is connected to the reflector 5, which is conductive in this case. In detail, the connection is made with a base 53 that is introduced in the region of the bottom face 5*b* of the reflector 5. The base 53 is integral with the reflector 5. Contacting is accomplished through a wire 73. The back contact is connected to the top face 1*a* of the conductive base part 1 through the support. The base part 1 is a copper board, for example. Positioning the LED 60 directly on the top face 1*a* also assures an efficient heat removal. The "external" contacting of the reflector 5 and of the base part 1 occurs in each case through the connecting areas 54 and 13, such as, for example, so-called soldering lugs or conductor paths. The connecting areas 54 and 14 are each integral with the head part 5 and the base part 1.

The housing 100 shown in FIG. 4.*b* corresponds partially to the housing 100 shown in FIG. 4.*a*. In contrast to it, two spacers 90 are also arranged between the bottom face 5*b* of the head part 5 and the top face 1*a* of the base part 1. The spacers 90 are positioned in the glass layer 1. The spacer 90 shown on the left is a separate component. The spacer 90 shown on the right is for illustration, since a short circuit would be formed here by being made integral with the base part 1, for example. However, what is not shown here is that a spacer can also be integrated in a matrix outside of the housing. Furthermore, an optical component 91, such as a lens 91, can also be placed in the passage area 61. It can be clamped and/or cemented in, for example. An LED 60 is also illustrated whose two connections are on its top face. Therefore, an additional wire bond 73 is also made to connect the second contact of the LED 60 to the connecting area 1*a* of the base part 1, in this case the top face 1*a* of the base part 1.

FIG. 4.*c* illustrates a three-layered housing. It is composed of or comprises a composite made up of the base part 1, the first glass layer 2, the two connecting parts 3, the second glass layer 4, and the head part 5.

The housing 100 illustrated in FIG. 4.*d* corresponds to the housing 100 illustrated in FIG. 4.*c*. In contrast to this, an optics/converter system 200 is also placed on the top face 100*a* of the housing 100. The optics/converter system 200 is a system like that in the previously cited patent application 08SGL0020DEP and P3156. The optics/converter system 200 comprises or is composed of the following components: a converter 201, an optical component 202, a ring 203, preferably made of metal, as support and connector with a coating 204, for example, with a soldering material. The optics/converter system 200 is connected to the housing 100, for example, through a soldered connection. A hermetic seal is formed.

Heat removal from the functional elements 60 proves to be very critical, especially for "High Power Light Emitting Diodes" as functional elements 60. For this reason, metals with a high thermal conductivity, such as copper and aluminum, are generally used for the base part 1. However, the metals named also have the drawback that in general they have higher thermal coefficients of expansion than glass.

While each of the embodiments described above show a "one-part" base part 1, each base part 1 illustrated in FIGS. 4.*e* to 4.*j* has a type of "sandwich" structure and/or "multicomponent" structure. The particular construction corresponds to the housing 100 illustrated in FIG. 4.*c*. However, the base parts 1 of the housings 100 are now made up of at least a first material 101 with high thermal conductivity and a second material 102 with a lower thermal coefficient of expansion than the first material 101. This multilayered and/or multi-component structure of the base part 1 compensates for the greater thermal expansion of the metal than that of the glass of the first glass layer 2. To produce the required heat removal for the functional element 60, the functional element 60 is also in thermal contact with the first material with high thermal conductivity. The functional element 60 rests directly or indirectly against the first material 101.

Copper has proved to be extremely suitable for the first material 101. This is because on the one hand, copper has good thermal conductivity. On the other hand, the copper-glass bonds or copper oxide-glass bonds also prove to be extremely stable. As evidence of this, reference is made to FIGS. 6.a and 6.b and the following description. In addition, copper is chemically stable with respect to the glasses used and has a sufficiently high melting point. Copper can also be purchased and/or machined, especially punched, at reasonable cost. Therefore, copper preferably always constitutes a component of the base part 1.

The second material 102 preferably has a thermal coefficient of expansion that is adapted to the thermal coefficient of expansion of the first material 101 and/or of the glass used for the first glass layer 2. The difference between the thermal coefficients of expansion of the glass 2 used and the second material 102 is generally less than 3 ppm/° C. The second material 102 preferably is or comprises a metal. NiFe alloys, molybdenum, and/or steel represent possible examples.

In FIG. 4.e the base part 1 is made up of three layers 103, 104, 105. To produce the appropriate heat removal or dissemination for the functional element 60, the top layer 103 is made up of the first material 101. The bottom third layer 105 is positioned for reasons of symmetry and is preferably likewise made of the first material 101. To obtain adequate thermal conductivity, the layers of the first material 101, in this case 103 and 105, have a thickness greater than 200 μm. To compensate for the thermal expansion, an intermediate layer 104 or layer of the second material 102 with a lower thermal coefficient of expansion than the first material 101 is provided between the upper layer 103 and the bottom layer 105. The intermediate layer 104 "impresses" the required thermal expansion on the first material 101. To obtain heat transport, the intermediate layer 104 is generally made thinner than the outer layers 103 and 105. A typical thickness is in the range of about 80 to 120 μm. It is possible to adapt the thermal expansion properties by varying the layer materials and/or the layer thicknesses. For cost reasons, the base part 1 made up of several layers 103, 104, 105 is produced by rolling, for example.

The housing 100 illustrated in FIG. 4.f corresponds to the housing 100 illustrated in FIG. 4.e. In contrast to this, the top layer 103 of the base part 1 that is in contact with the first glass layer 2 has a structured design. The functional element 60 is positioned on a type of platform and, in particular, is electrically insulated from the outer region of the top layer 103 of the base part 1.

The housing 100 illustrated in FIG. 4.g corresponds to the housing 100 illustrated in FIG. 4.e. While a horizontal layer structure or a layer structure with superimposed layers 103, 104, and 105 is shown in FIG. 4.e, the base part 1 shown in FIG. 4.g, in contrast to that, is constructed of multiple sheets or layers 106 and 107 in the lateral direction. In other words, the layers 106 and 107 are arranged side by side. The first material 101 is placed in contact with the functional element 60. It is positioned in the region of the center 106 of the base part 1 as an intermediate layer 106. The second material 102 extends as a kind of frame 107 at least in sections over the peripheral extent around the center 106. This frame 107 "impresses" the thermal expansion on the center 106 or compensates for its sharp expansion. The first material 101 can be introduced into the second material 102 by being driven in, for example.

A housing 100 is illustrated in FIG. 4.h that corresponds to the housing 100 illustrated in FIG. 4.g. Another layer 108 is additionally placed on the second material 102 as an adhesion aid. This other layer 108, in particular, is a ring 108. The ring 108 in a preferred embodiment is a copper ring with an oxidized surface. Depending on the thickness of this other layer 108, it is applied to the base part 1 by electroplating or laminating. The other layer 108 is preferably a punched material. This makes a composite between the base part 1 and the first glass layer 2 with increased stability. Another layer, preferably made of copper, can also be positioned as an adhesion aid between the bottom face 5b of the head part 5 and the second glass layer 4. However, this is not shown in the figure. Since high thermal conductivity is not necessary in this region, this layer 108 can be designed with a smaller thickness in the range of 5 to 10 μm.

FIG. 4.i shows an enhancement of the invention in which the base part 1 is made up essentially of a layer 103 of the first material 101. To match the required expansion, a layer 109 of the second material 102 is placed on the top face 1a of the base part 1, as a ring 109, for example. However, a ring can also be placed on the bottom face 1b of the base part 1 (not shown in the figures).

FIG. 4.j shows an embodiment of the housing 100 in which the base part 1 is made up of a "matrix" material in which the appropriate materials are embedded, for example. Materials that in "sum" or in combination have the necessary thermal conductivity and the necessary thermal expansion adapted to the glass used are combined with one another. For example, the material for the base part 1 can be produced by sintering. In the embodiment shown, particles of the second material 102, for example such as molybdenum, are embedded in a matrix of the first material 101, such as a copper matrix, for example.

In one embodiment, a so-called white LED 60 is obtained by interaction of the optics/converter system 200, particularly of the converter 201, with the LED 60. The emitted light is perceived by a receiver as white light. A so-called (W) LED 60 is formed. The white light is produced by additive color mixing. The LED 60 is a blue-emitting LED 60, for example, and the converter 201 is a glass that contains a luminescent dye, such as so-called yellow phosphorus. The short-wave blue light excites the dye to radiate light. This effect is called photoluminescence. Yellow light with a longer wavelength is emitted. In general, not all of the blue light is converted. The white light thus results from an additive color mixing of the two spectral colors blue and yellow.

FIG. 5 shows a cutaway section of a housing 100 with a detailed view of a connecting part 3. The housing 100 can be mounted, for example, on a holder 71 or plate 71. The electrical contacting of the functional element 60, not shown, is made through the connecting part 3, for example, and a conductor path 72 of the plate 71, which are connected by a soldered joint 71. The connecting part 3 here is bent into its final form. The housing 100 or the base part 1 of the housing 100 is so mechanically stable that it is possible to bend the connecting part 3 without bending the entire housing 100.

Compared to known housings, the housing 100 pursuant to the invention is extremely stable thermally. The housing design makes it possible to work at higher operating temperatures than are possible with the usual resins and plastics of the prior art. For this reason, "lead-free" soldering techniques can also be used, which in general require a high processing temperature (above 200° C.). The design presents multiple options for the construction of such a housing 100. This presents additional options, particularly for soldering, for fastening the functional element 60 to the base part 1. Hermetic encapsulation is also made possible.

The embodiments in which the bonding is conducted through copper, especially the copper oxide layer, and glass, are also distinguished by increased adhesion between the glass and the copper, especially by means of the copper oxide layer. In this regard, FIGS. 6.a to 6.b each show experimental results on the adhesion of glass to a metal strip. In detail, the "peeling" behavior of a glass bead is illustrated, on the one hand, on an NiFe strip (FIG. 6.a) and, on the other hand, on an oxide layer with a basis weight of about 0.1 mg/cm² on a copper strip (FIG. 6.b). In the case of the NiFe strip, the glass bead jumps off "completely" from the strip after a certain load, here starting at a certain bending angle. The surface of the NiFe strip is unchanged. In contrast to this, in the case of the copper strip the tear does not occur at the glass/metal interface, but crosswise through the glass. The glass remains adhered to the copper. In other words, the glass "rips apart" instead of being loosened from the surface. Thus there is outstanding adhesion.

Without being tied to a theory, the inventors assume that the oxide layer on the copper has a considerable effect on adhesion. The copper oxide is partly stripped or dissolved when the copper binds with the glass. The copper oxide diffuses into the glass. A gradient layer is developed. The amount of copper oxide in the glass decreases from the surface into the bulk of the glass. Surprisingly, there is diffusion of the copper oxide into the glass up to a depth of about 200 μm. In this regard, FIG. 6.c shows as an example the depth of penetration of copper into the glass S-8061. Measurement was made by energy-dispersive X-ray analysis (EDX). The measured depth distribution and the concentration of the copper are shown as a function of depth (normalized to the concentration of copper at the surface). The concentration directly at the interface depends on the oxide thickness before the fusion process for bonding. It can amount to several percent. In general, the concentration of copper at the interface is in the range of about 0.1 to about 15%.

A housing 100 produced by the method pursuant to the invention has other advantages over the known housings. Specifications such as those required in the processing of LEDs can also be met. A material with high thermal conductivity can be provided as the base 1 or the base part 1. The heat produced by an LED can be efficiently distributed and carried off by the heat sink that is provided by the base part, since the LED to be installed is in direct contact with the heat sink, in this case the base 1. The package is essentially devoid of organic materials. The method is compatible with so-called methods for SMDs ("Surface-Mountable Devices"). It is possible to produce and deliver housings 100 in matrix form. The method makes cost-reduced production possible. The design with conical, partially stepped reflectors is possible, and/or there is the possibility of a combination with glass lenses and/or optics/converter systems 200.

FIGS. 7.a and 7.b each illustrate a grouping or a plurality of housings 100 according to the present invention. Such so-called arrays are important, among other things, for commercial uses, such as, for example, in the automobile sector for a headlight and/or a rear light and/or interior lighting. The housings 100 are illustrated here in a round shape by way of example. The array can be produced by the housings 100 being held in a matrix 10 and 50, as illustrated in FIGS. 3.a to 3.c. The connecting parts 3 of the individual housings can be brought together so that a plurality of housings can be operated by means of a single anode and/or by means of a single cathode. FIG. 7.c, on the other hand, illustrates a housing 100 in which a plurality of LEDs 60, four LEDs here by way of example, are arranged in a housing 100. All of the LEDs 60 are arranged on the assembly region 12 inside the housing 100. The LEDs 60, as illustrated, can each have their own connection 3, or their own lead-in 3, for example with at least two lines. The connections 3 of the individual LEDs 60, however, can also be combined or partially combined, so that the housing 100 can have only a single connector 3 for all of the LEDs. The wires 73 here of the individual LEDs 60 can also be fed to one connector 3 or two connectors 3.

It is obvious to one skilled in the art that the embodiments described are to be considered examples. The invention is not limited to them, but can be varied in innumerable ways without departing from the essence of the invention. Features of individual embodiments and the features mentioned in the general part of the description can each be combined among themselves or with one another.

LIST OF REFERENCE SYMBOLS

1 Base part or base or support
1a Top (face) of the base part
1b Bottom (face) of the base part
2 First glass layer or glass sheet
3 Connecting part or conductor sheet
3a Top (face) of the connector strip
3b Bottom (face) of the connecting part
4 Second glass layer or glass sheet
5 Head part or reflector
5a Top (face) of the head part
5b Bottom (face) of the head part
10 Matrix for the base part
11 Base part-matrix connecting crosspiece
12 Assembly region for the functional element
13 Connecting area of the base part
21 Recess in the first glass layer
22 Support area for the connecting part
30 Matrix for the connecting part
31 Connecting part-matrix connecting crosspiece
41 Recess in the second glass layer
42 Support area for the connecting part
50 Matrix for the head part
51 Head part-matrix connecting part
52 Recess in the head part
53 Functional element connecting area or base
54 Connecting area of the head part
60 Optoelectronic functional element or LED
61 Passage area
70 Solder joint
71 Holder or plate
72 Conductor path of the plate
73 Wire or wire-bonding
80 Heat or thermal radiation
90 Spacer
91 Optical component or lens
100 Housing or functional element housing
100a Top face of the housing
101 First material with high thermal conductivity
102 Second material with less thermal expansion
103 Top or outer layer of the base part
104 Intermediate layer of the base part
105 Bottom or outer layer of the base part 106 Center of the base part
107 Frame of the base part
108 Other layer or ring of the first material
109 Other layer or ring of the second material
200 Optics/converter system or converter unit
201 Converter
202 Optical component or optics
203 Ring or metal ring or metal support
204 Coating or cladding

The invention claimed is:

1. A housing for an optoelectronic functional element, comprising:
    a composite made up of at least a base part and a head part, which are connected by a first glass layer positioned between a top face of the base part and a bottom face of the head part; and
    a section of the top face of the base part defines an assembly region for the optoelectronic functional element so that the base part forms a heat sink for the optoelectronic functional element,
    wherein the head part extends, at least in sections, over a peripheral extent of the assembly region and forms over the assembly region a passage area for radiation emitted from and/or to be received by the optoelectronic functional element, and
    wherein the head part and the base part comprise copper, and the top face of the base part is pre-oxidized and the bottom face of the head part is pre-oxidized so that a weight of oxide with a basis weight of about 0.02 to about 0.25 mg/cm$^2$ is formed.

2. The housing pursuant to claim 1, wherein the base part is made up of at least two layers superimposed on one another and/or are arranged side by side.

3. The housing pursuant to claim 1, wherein the base part is made up of at least two layers that comprises a first material in thermal contact with the optoelectronic functional element and a second material on the first glass layer, the second material having a thermal expansion that matches a thermal expansion of the first material.

4. The housing pursuant to claim 1, wherein the base part is structured at least in sections on its top face.

5. The housing pursuant to claim 1, wherein the base part is constructed of a first material and a second material, and wherein the first material is embedded in the second material or the second material is embedded in the first material.

6. The housing pursuant to claim 1, wherein the head part has at least one connecting area for the optoelectronic functional element, and wherein the at least one connecting area is on an internal face of the head part.

7. The housing pursuant to claim 1, wherein the passage area has an internal face with reflecting properties, at least in sections.

8. The housing pursuant to claim 1, wherein the base part has at least one connecting area for the optoelectronic functional element.

9. The housing pursuant to claim 8, wherein the at least one connecting area is disposed between the bottom face of the head part and the top face of the base part or the at least one connecting area is connected to the composite at least by the first glass layer and/or a second glass layer.

10. The housing pursuant to claim 9, further comprising a connecting part disposed between the first glass layer and a second glass layer.

11. The housing pursuant to claim 10, wherein the first glass layer and/or the second glass layer is or are reduced in height in an area that rests on the at least one connecting part.

12. The housing pursuant to claim 10, further comprising at least one spacer disposed between the base part and the head part and/or between the base part and the connecting part and/or between the head part and the connecting part.

13. The housing pursuant to claim 9, further comprising a ratio between a surface area of the first glass layer or of the second glass layer and a surface area of the housing is a ratio of about 1/10 to about 9/10.

14. The housing pursuant to claim 9, wherein a connecting part, the connecting area and/or the connecting area are connected in such a way that a plurality of optoelectronic functional elements can be supplied by a single anode and/or a single cathode.

15. An optoelectronic component, comprising:
    at least one radiation-emitting and/or radiation-receiving optoelectronic functional element; and
    a housing comprising:
        a composite made up of at least a base part and a head part, which are connected by a first glass layer positioned between a top face of the base part and a bottom face of the head part; and
        a section of the top face of the base part defines an assembly region for the at least one optoelectronic functional element so that the base part forms a heat sink for the at least one optoelectronic functional element,
        wherein the head part extends, at least in sections, over a peripheral extent of the assembly region and forms over the assembly region a passage area for radiation emitted from and/or to be received by the at least one optoelectronic functional element,
        wherein the head part and the base part comprise copper, and the top face of the base part is pre-oxidized and the bottom face of the head part is pre-oxidized, so that a weight of oxide with a basis weight of about 0.02 to about 0.25 mg/cm$^2$ is formed, and
    wherein the at least one optoelectronic functional element is disposed in the housing.

16. A method for producing an optoelectronic functional element housing, comprising
    providing at least one base part whose top face defines, at least in sections, an assembly region for the optoelectronic functional element so that the base part forms a heat sink for the optoelectronic functional element;
    providing at least one head part that extends at least in sections over a peripheral extent of the assembly region and over the assembly region to form a passage area for the radiation emitted from and/or to be received by the optoelectronic functional element, wherein the base part is in a matrix with a plurality of base parts and/or the head part is in a matrix with a plurality of head parts;
    providing at least a first glass layer between the top face of the base part and the bottom face of the head part;
    assembling the base part, the first glass layer, and the head part; and
    heating the first glass layer until the glass reaches a viscosity at which the glass adheres and the base part and the head part to form a composite at least by the first glass layer so that a plurality of housings are produced at the same time,
    wherein the housings are fastened to the matrix with the plurality of base parts and/or to the matrix with the plurality of head parts through the base part and/or the head part by connecting crosspieces.

17. The method pursuant to claim 16, further comprising disposing at least one connecting part between the bottom face of the head part and the top face of the base part.

18. The method pursuant claim 16, further comprising disposing at least a second glass layer between the top face of the base part and the bottom face of the head part and joining the second glass layer to the composite by heating.

19. The method pursuant to claim 18, further comprising disposing the connecting part between the first glass layer and the second glass layer.

20. The method pursuant to claim 16, further comprising pre-oxidizing at least the top face of the base part and/or at least the bottom face of the head part.

21. An optoelectronic component comprising a housing pursuant to claim 1.

\* \* \* \* \*